United States Patent
Yamamoto et al.

(10) Patent No.: US 9,401,492 B2
(45) Date of Patent: Jul. 26, 2016

(54) LIGHT-EMITTING ELEMENT, LIGHT-EMITTING DEVICE, DISPLAY DEVICE, AND ELECTRONIC APPARATUS

(71) Applicant: SEIKO EPSON CORPORATION, Tokyo (JP)

(72) Inventors: Hidetoshi Yamamoto, Suwa (JP); Akio Fukase, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/643,439

(22) Filed: Mar. 10, 2015

(65) Prior Publication Data

US 2015/0287947 A1  Oct. 8, 2015

(30) Foreign Application Priority Data

Apr. 4, 2014  (JP) .................................. 2014-078251

(51) Int. Cl.
  *H01L 51/50* (2006.01)
  *H01L 51/00* (2006.01)

(52) U.S. Cl.
  CPC .............. *H01L 51/504* (2013.01); *H01L 51/006* (2013.01); *H01L 51/0054* (2013.01); *H01L 51/0056* (2013.01); *H01L 51/0058* (2013.01); *H01L 51/0059* (2013.01); *H01L 51/0072* (2013.01); *H01L 51/5056* (2013.01); *H01L 51/5072* (2013.01)

(58) Field of Classification Search
  CPC .............. H01L 51/504; H01L 51/5056; H01L 51/5072; H01L 51/0059
  See application file for complete search history.

(56) References Cited

U.S. PATENT DOCUMENTS

| | | | |
|---|---|---|---|
| 2004/0150352 A1 | 8/2004 | Koide et al. | |
| 2005/0112404 A1 | 5/2005 | Hamada et al. | |
| 2009/0146552 A1* | 6/2009 | Spindler ............. | H01L 51/5036 313/504 |

FOREIGN PATENT DOCUMENTS

| | | |
|---|---|---|
| JP | 2004-226673 A | 8/2004 |
| JP | 2005-108727 A | 4/2005 |
| JP | 2011-508368 A | 3/2011 |
| JP | 2011-159502 A | 8/2011 |
| WO | 2009/075741 A1 | 6/2009 |

* cited by examiner

*Primary Examiner* — Mamadou Diallo
(74) *Attorney, Agent, or Firm* — Oliff PLC

(57) ABSTRACT

Disclosed herein is a light-emitting element, including: a cathode; an anode; and a light-emitting unit, in which the light-emitting unit includes a first light-emitting layer, a second light-emitting layer, and a third light-emitting layer, which are laminated from the anode side to the cathode side, in which each of the first, second, and third light-emitting layers is configured to contain a luminescent material, a host material, and an assist dopant material, and in which, when the contents of the assist dopant materials contained in the first, second, and third light-emitting layers are respectively expressed by $C_{Assist}(EML1)$, $C_{Assist}(EML2)$ and $C_{Assist}(EML3)$, the following Relational Expression (A) is satisfied:

$$C_{Assist}(EML1) \geq C_{Assist}(EML2) > C_{Assist}(EML3) \geq 0 \qquad (A).$$

16 Claims, 4 Drawing Sheets

LIGHT-EMITTING ELEMENT, LIGHT-EMITTING DEVICE, DISPLAY DEVICE, AND ELECTRONIC APPARATUS

BACKGROUND

1. Technical Field

The present invention relates to a light-emitting element, a light-emitting device, a display device, and an electronic apparatus.

2. Related Art

An organic electroluminescence element (so-called organic EL element) is a light-emitting element having a structure in which a luminescent organic layer of at least one layer is interposed between an anode and a cathode. In such a light-emitting element, when an electric field is applied between a cathode and an anode, electrons are injected into a light-emitting layer from the cathode and holes are injected into the light-emitting layer from the anode, and thus the electrons and holes are recombined in the light-emitting layer, that is, carriers are recombined to generate excitons. When these excitons return to a ground state, the energy content is emitted as light.

Generally, such a light-emitting layer emitting light is formed of a luminescent material (luminescent dopant) and a host material.

Here, the host material, among the constituents of the light-emitting layer, is generally contained at the highest ratio. This host material serves to support the film of the light-emitting layer, and is configured such that, when a voltage is applied between electrodes, carriers are recombined in the molecule of the host material to generate excitation energy, and this excitation energy is transferred to a luminescent material, thereby causing the luminescent material to emit light. In contrast, the luminescent material is a compound having fluorescence or phosphorescence, and is configured such that it receives excitation energy from the host material to be excited, thus substantially emitting light.

In an organic El element having such a configuration, the recombination sites of carriers are determined by the carrier transportability of the host material used in the light-emitting layer. When a fluorescent material is used as the luminescent material, in many cases where a host material containing an acene-based compound such as anthracene or naphthacene is generally used as the host material thereof, bias is large in the carrier transportability of holes and electrons. Therefore, the recombination sites of carriers are concentrated in the vicinity of the interface of the light-emitting layer. As a result, only the luminescent material in the vicinity of the interface of the light-emitting layer, that is, only some luminescent material in the light-emitting layer contributes to light emission. Accordingly, there is a problem that, in the luminescent material located in the vicinity of the interface, the degradation of the luminescent material is locally promoted, and thus the deterioration of luminance of the light-emitting layer is accelerated.

In contrast to this, in recent years, it has been reported that a light-emitting layer contains an assist dopant material for controlling carrier transportability as a constituent material in addition to a luminescent material and a host material, and thus the carrier transportability in the light-emitting layer is controlled, thereby enhancing the efficiency of an organic EL element and increasing the lifetime thereof (for example, refer to JP-A-2005-108727).

However, in JP-A-2005-108727, the characteristics of the organic EL element are improved by controlling the relationship between HOMO and LUMO of the host material and the assist dopant material, but carrier transportability of holes and electrons cannot be sufficiently controlled only by controlling the relationship between HOMO and LUMO, and it cannot be said that the recombination sites of carriers in the light-emitting layer are set to a good position.

SUMMARY

An advantage of some aspects of the invention is to provide a light-emitting element having excellent luminescence characteristics and lifetime characteristics maintaining such luminescence characteristics over a long period of time, a light-emitting device including the light-emitting element and having excellent reliability, a display device, and an electronic apparatus.

The invention is realized in the following forms.

According to an aspect of the invention, there is provided a light-emitting element, including: a cathode; an anode; and a light-emitting unit provided between the cathode and the anode to emit light when a driving voltage is applied, in which the light-emitting unit includes a first light-emitting layer emitting first light, a second light-emitting layer emitting second light having a different color from the first light, and a third light-emitting layer emitting third light having the same color as the second light, which are laminated from the anode side to the cathode side, in which each of the first, second, and third light-emitting layers is configured to contain a luminescent material, a host material supporting the luminescent material, and an assist dopant material, in which one of the host material and the assist dopant material is material having high electron transportability, and the other thereof is a material having high hole transportability, and in which, when the contents of the assist dopant materials contained in the first, second, and third light-emitting layers are respectively expressed by $C_{Assist}(EML1)$, $C_{Assist}(EML2)$ and $C_{Assist}(EML3)$, the following Relational Expression (A) is satisfied:

$$C_{Assist}(EML1) \geq C_{Assist}(EML2) > C_{Assist}(EML3) \geq 0 \qquad (A).$$

Thus, it is possible to obtain a light-emitting element having excellent luminescence characteristics and lifetime characteristics maintaining such luminescence characteristics over a long period of time.

In the light-emitting element, the host material may be a material having high electron transportability, and the assist dopant material may be a material having high hole transportability.

In the light-emitting element, in each of the first, second, and third light-emitting layers, when mobility of holes is expressed by $\mu h$ and mobility of electrons is expressed by $\mu e$, in the first light-emitting layer and the second light-emitting layer, the following Relational Expression (1) may be satisfied:

$$0.01 \leq \mu e/\mu h \leq 100 \qquad (1).$$

Thus, in the first light-emitting layer and the second light-emitting layer, it is possible to transfer holes and electrons with good balance. Therefore, the position where carriers are recombined (recombination site) can be spaced sufficiently from the vicinity of the interface between the anode side and the first light-emitting layer, and this recombination sites can be reliably spread over the first and second light-emitting layers.

In the light-emitting element, in the third light-emitting layer, the following Relational Expression (2) may be satisfied:

$$\mu e/\mu h \geq 100 \qquad (2).$$

Thus, in the third light-emitting layer, it is possible to more reliably suppress or prevent the holes having passed through the first and second light-emitting layers from passing through the third light-emitting layer and then reaching the cathode side.

In the light-emitting element, when the thicknesses of the second and third light-emitting layers are respectively expressed by T(EML2) and T(EML3), the following Relational Expression (B) may be satisfied:

$$T(EML2) \leq T(EML3) \quad (B).$$

Thus, it is possible for the third light-emitting layer to more reliably function as a block layer suppressing or preventing the passage of holes toward the cathode side compared to the third light-emitting layer.

In the light-emitting element, the host material may be an acene-based compound.

Since the acene-based compound is a host material having high electron transportability, it is suitably used as the host material of the light-emitting layer required to easily supply electrons to the anode side.

In the light-emitting element, the assist dopant material may be an amine-based compound.

Thus, the content of the assist dopant material can easily be set to content satisfying the above Relational Expression (A).

In the light-emitting element, the amine-based compound may be a compound represented by the following Formula (4).

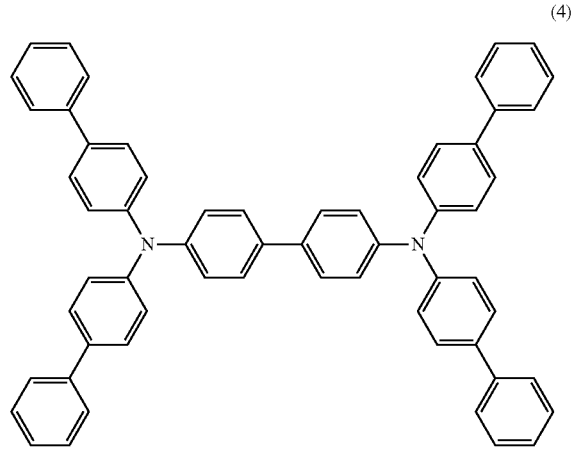 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]

(4)

Thus, the content of the assist dopant material can easily be set to content satisfying the above Relational Expression (A).

The light-emitting element may emit light of white color as emission color.

The light-emitting element can be suitably applied to a light-emitting element emitting light of white color as emission color.

According to another aspect of the invention, there is provided a light-emitting device including the light-emitting element.

Thus, it is possible to provide a light-emitting device that can be driven at a comparatively low voltage.

According to still another aspect of the invention, there is provided a display device including the light-emitting device.

Thus, it is possible to provide a display device that can be driven at a comparatively low voltage.

According to still another aspect of the invention, there is provided an electronic apparatus including the display device.

Thus, it is possible to provide an electronic apparatus that can be driven at a comparatively low voltage.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of a light-emitting element, a light-emitting device, a display device, and an electronic apparatus of the invention will be described with reference to the accompanying drawings.

First, a light-emitting element (organic electroluminescence element) 1 of the invention will be described.

Figure 1:
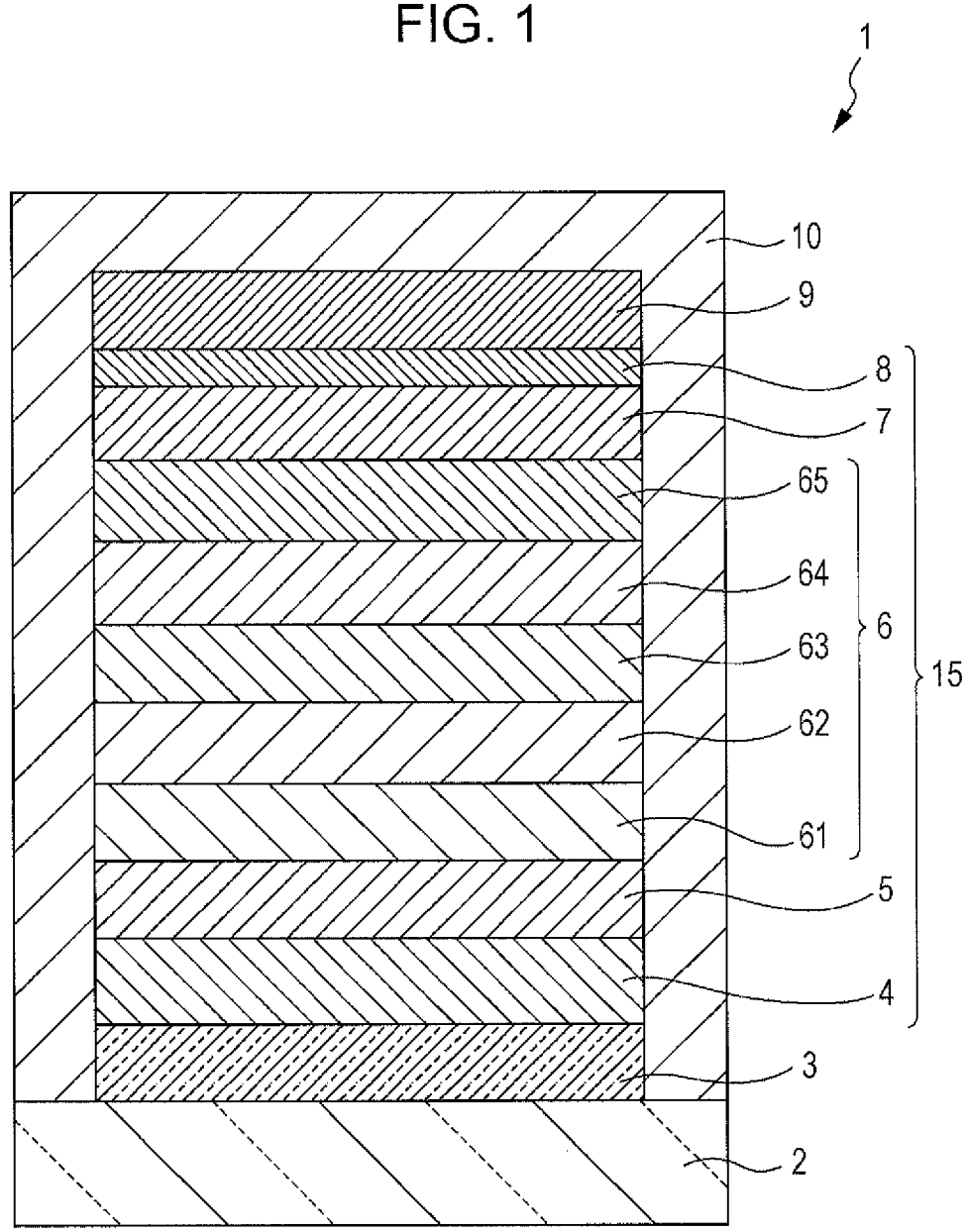
FIG. 1 is a schematic longitudinal sectional view showing an embodiment of the light-emitting element of the invention.

FIG. 1 is a schematic longitudinal sectional view showing an embodiment of the light-emitting element of the invention. Hereinafter, for convenience of description, in FIG. 1, an upper side is represented as "on", and a lower side is represented as "beneath".

The light-emitting element (electroluminescence element) 1 shown in FIG. 1 is an organic light-emitting element (white light-emitting element) that emits light of white color as an emission color by allowing several kinds of organic luminescent materials to emit red light (R), green light (G), and blue light (B).

Such a light-emitting element 1 is configured such that an anode 3, a hole injection layer 4, a hole transporting layer 5, a light-emitting unit 6 composed of a plurality of light-emitting layers, an electron transporting layer 7, an electron injection layer 8, and a cathode 9 are sequentially laminated. Here, the light-emitting unit 6 is an laminate in which a red light-emitting layer (fourth light-emitting layer) 61, an intermediate layer 62, a blue light-emitting layer (first light-emitting layer) 63, a first green light-emitting layer (second light-emitting layer) 64, and a second green light-emitting layer (third light-emitting layer) 65 are sequentially laminated from the anode 3 side to the cathode 9 side.

Further, the entire light-emitting element 1 is provided on a substrate 2, and is sealed with a sealing member 10.

In this light-emitting element 1, when a driving voltage is applied to the anode 3 and the cathode 9, electrons are supplied (injected) from the cathode 9 side to the red light-emitting layer 61, the blue light-emitting layer 63, the first green light-emitting layer 64, and the second green light-emitting layer 65, and holes are supplied (injected) from the anode 3 side thereto. And, in each of the light-emitting layers, holes and electrons are recombined, the energy generated by the recombination thereof generates excitons, and these excitons return to a ground state to generate (emit) energy (fluorescence or phosphorescence). Therefore, the light-emitting element 1 emits white light.

The substrate 2 serves to support the anode 3. Since the light-emitting element 1 of the present embodiment (bottom emission type) is configured to extract light from the substrate 2 side, each of the substrate 2 and the anode 3 is substantially transparent (colorless and transparent, colored transparent, or translucent).

Examples of the constituent material of the substrate 2 include resin materials, such as polyethylene terephthalate, polyethylene naphthalate, polypropylene, a cycloolefin polymer, polyamide, polyether sulfone, polymethyl methacrylate, polycarbonate, and polyarylate; and glass materials, such as quartz glass and soda glass. They can be used alone or in a combination of two or more thereof.

The average thickness of this substrate 2 is not particularly limited, but is preferably about 0.1 mm to 30 mm, and more preferably about 0.1 mm to 10 mm.

Meanwhile, when the light-emitting element 1 (top emission type) is configured to extract light from a side opposite to the substrate 2, either a transparent substrate or an opaque substrate can be used as the substrate 2.

Examples of the opaque substrate include a substrate made of a ceramic material such as alumina, a substrate which is made of a metal such as stainless steel and on which an oxide film (insulation film) is provided, a substrate made of a resin material, and the like.

Hereinafter, each unit constituting the light-emitting element 1 will be sequentially described.

Anode

The anode 3 is an electrode serving to inject holes into the hole transporting layer 5 through the hole injection layer 4 to be described later. As the constituent material of the anode 3, a material having a high work function and excellent conductivity is preferably used.

Examples of the constituent material of the anode 3 include oxides, such as indium tin oxide (ITO), indium zinc oxide (IZO), $In_2O_3$, $SnO_2$, Sb-containing $SnO_2$, and Al-containing znO; and Au, Pt, Ag, Cu, and alloys thereof. They can be used alone or in a combination of two or more thereof.

The average thickness of this anode 3 is not particularly limited, but is preferably about 10 nm to 200 nm, and more preferably about 50 nm to 150 nm.

Cathode

On the other hand, the cathode 9 is an electrode serving to inject electrons into the electron transporting layer 7 through the electron injection layer 8 to be described later. As the constituent material of the cathode 9, a material having a low work function is preferably used.

Examples of the constituent material of the cathode 9 include Li, Mg, Ca, Sr, La, Ce, Er, Eu, Sc, Y, Yb, Ag, Cu, Al, Cs, Rb, and alloys thereof. They can be used alone or in a combination of two or more thereof (for example, a laminate of a plurality of layers).

Particularly, when an alloy is used as the constituent material of the cathode 9, an alloy containing a stable metal element such as Ag, Al, or Cu, specifically, an alloy such as MgAg, AlLi, or CuLi is preferably used. When such an alloy is used as the constituent material of the cathode 9, it is possible to improve the electron injection efficiency and stability of the cathode 9.

The average thickness of this cathode 9 is not particularly limited, but is preferably about 100 nm to 10000 nm, and more preferably about 100 nm to 500 nm.

Since the light-emitting element 1 of the present embodiment is a bottom emission type light-emitting element, the cathode 9 is not particularly required to have optical transparency.

Hole Injection Layer

The hole injection layer 4 is a layer having a function of improving a hole injection efficiency from the anode 3 (that is, having hole injection properties).

This hole injection layer 4 contains a material having hole injection properties (that is, a hole injecting material).

The hole injecting material is not particularly limited, but examples thereof include copper phthalocyanine, 4,4',4"-tris(N,N-phenyl-3-methylphenylamino)triphenylamine (m-MTDATA), and N,N'-bis-(4-diphenylamino-phenyl)-N,N'-diphenyl-biphenyl-4-4'-diamine represented by the following Formula (1).

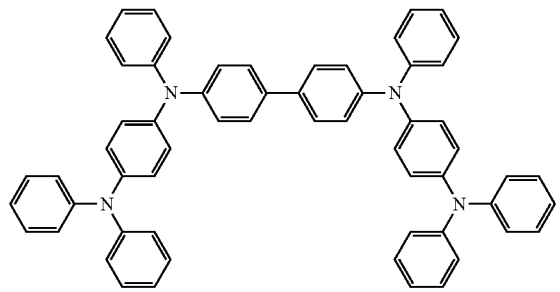

(1)

Among them, from the viewpoint of excellent hole injection properties, an amine-based compound is preferably used as the hole injecting material.

The average thickness of this hole injection layer 4 is not particularly limited, but is preferably 1 nm to 100 nm, and more preferably 1 nm to 80 nm. Therefore, it is possible to make the driving voltage of the light-emitting element 1 lower.

Hole Transporting Layer

The hole transporting layer 5 is provided in contact with the hole injection layer 4, and has a function of transporting the holes injected from the anode 3 through the hole injection layer 4 to the red light-emitting layer 61. As the constituent material of the hole transporting layer 5, various p-type polymer material and various p-type low-molecular materials can be used alone or in a combination thereof. For example, an amine-based compound having amine in its chemical structure can be used.

The amine-based compound is a material capable of suitably extracting electrons by the hole injecting material and easily injecting holes. Therefore, when the amine-based compound is used as the constituent material of the hole transporting layer 5, holes can be suitably injected from the anode 3 through the hole injection layer 4, and the light-emitting element 1 can be suitably driven even at a lower voltage.

Examples of the amine-based compound include N,N'-di (1-naphthyl)-N,N'-diphenyl-1,1'-biphenyl-4,4'-diamine (α-NPD) represented by the following Formula (2), N,N'-diphenyl-N,N'-bis(3-methylphenyl)-1,1'-biphenyl-4,4'-diamine (TPD), a compound represented by the following Formula (3), a tetraarylbenzidine derivative such as a compound represented by the following Formula (4), and a tetraaryl diaminofluorene compound or a derivative thereof. They can be used alone or in a combination of two or more thereof.

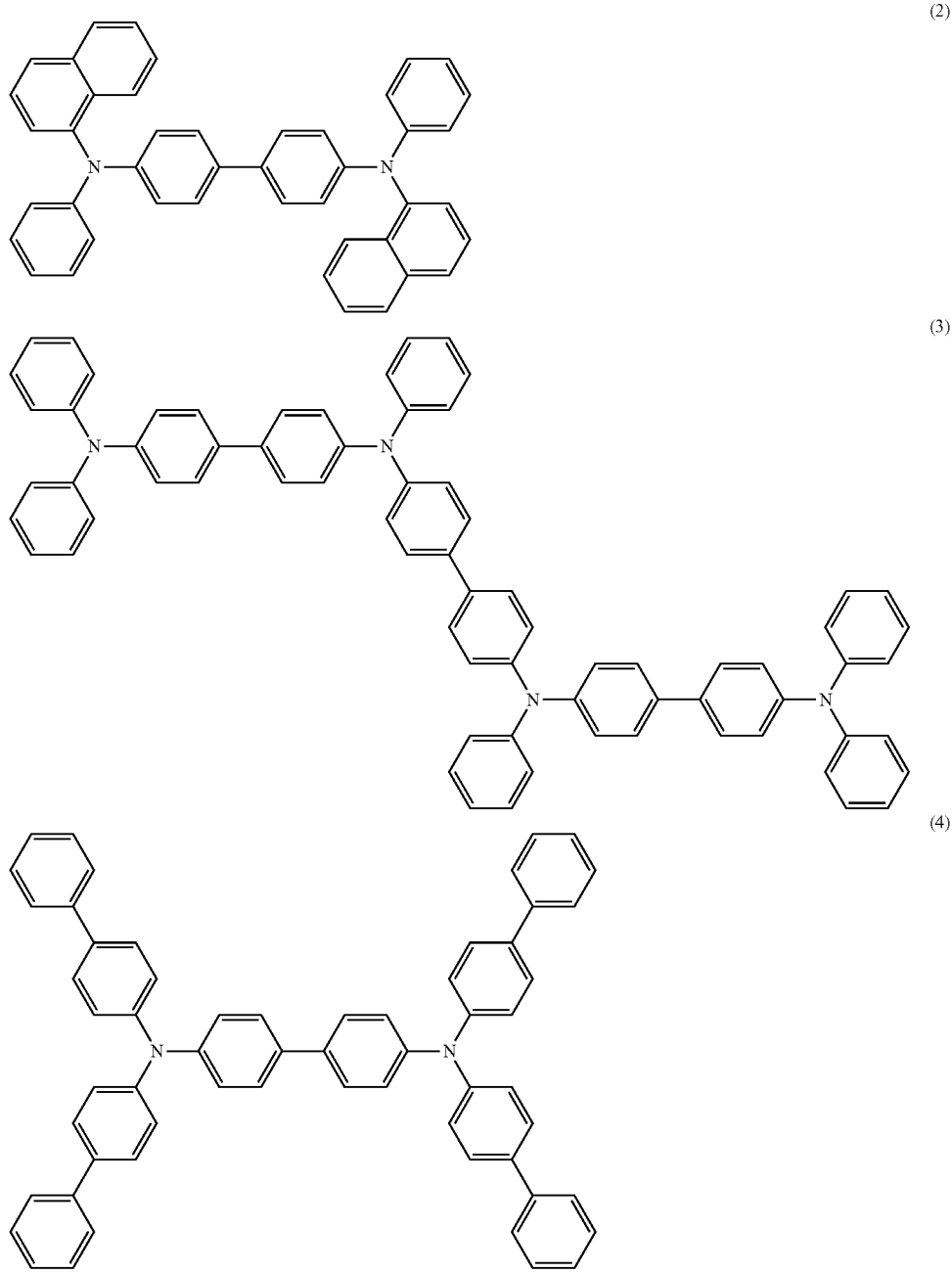

Particularly, among them, as the amine-based compound, N,N-di(1-naphthyl)-N,N'-diphenyl-1,1'-biphenyl-4,4'-diamine (α-NPD) represented by the above Formula (2) is preferably used. Since this compound can more suitably extract electrons by the hole injecting material, and, particularly, easily inject holes, the light-emitting element 1 can be suitably driven even at a lower voltage.

The average thickness of this hole transporting layer 5 is not particularly limited, but is preferably 10 nm to 150 nm, and more preferably 10 nm to 100 nm.

Light-Emitting Unit

As described above, the light-emitting unit 6 is an laminate in which the red light-emitting layer (fourth light-emitting layer) 61, the intermediate layer 62, the blue light-emitting layer (first light-emitting layer) 63, the first green light-emitting layer (second light-emitting layer) 64, and the second green light-emitting layer (third light-emitting layer) 65 are sequentially laminated from the anode 3 side.

Hereinafter, these light-emitting layers will be sequentially described, respectively. In the present embodiment, the blue light-emitting layer (first light-emitting layer) 63, the first green light-emitting layer (second light-emitting layer) 64, and the second green light-emitting layer (third light-emitting layer) 65 constitutes the first to third light-emitting layers of the light-emitting element of the invention.

Red Light-Emitting Layer

In the present embodiment, the red light-emitting layer (fourth light-emitting layer) 61 is configured to contain a red luminescent material (fourth luminescent material) emitting red light (fourth color light) and a host material (fourth host material) supporting the red luminescent material.

Such a red luminescent material is not particularly limited. As the red luminescent material, various red fluorescent materials and red phosphorescent materials can be used alone or in a combination of two or more thereof.

The red fluorescent material is not particularly limited as long as it emits red fluorescence, and, examples thereof include a perylene derivative represented by the following formula (5) such as a tetraaryl diindenoperylene derivative, a europium complex, a benzopyran derivative, a rhodamine derivative, a benzothioxanthene derivative, a porphyrin derivative, Nile Red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene)propanedinitrile (DCJTB), 4-(dicyanomethylene)-2-methyl-6-(p-dimethylaminostyryl)-4H-pyran (DCM), and the like.

The red phosphorescent material is not particularly limited as long as it emits red phosphorescence, and, examples thereof include metal complexes such as an iridium complex, a ruthenium complex, a platinum complex, an osmium complex, a rhenium complex, and a palladium complex. At least one of ligands of this metal complex has a phenyl pyridine skeleton, a bipyridyl skeleton, a porphyrin skeleton, or the like. Specific examples thereof include tris(1-phenylisoquinoline)iridium, bis[2-(2'-benzo[4,5-α]thienyl)pyridinate-N,C³']iridium(acetylacetonate) (btp2Ir (acac)), 2,3,7,8,12,13,17,18-octaethyl-12H,23H-porphyrin-platinum(II), bis[2-(2'-benzo[4,5-α]thienyl)pyridinate-N,C³']iridium, and bis(2-phenylpyridine)iridium(acetylacetonate).

Meanwhile, as the constituent material of the red light-emitting layer 61, a host material (fourth host material) using this red luminescent material as a guest material is included in addition to the red luminescent material (luminescent material). This host material recombines holes and electrons to generate exitons, and simultaneously transfers (Forster-transfers or Dexter-transfers) energy of the excitons to the red luminescent material to have a function of exciting the red luminescent material. For example, such a host material is doped with the red luminescent material (guest material) as a luminescent dopant, and is then used.

This fourth host material is not particularly limited as long as it exhibits the above-mentioned function for the red luminescent material to be used, but examples thereof, when the red luminescent material contains the red fluorescent material, include acene derivatives (acene-based compounds), such as an anthracene derivative represented by the following Formula (6), an anthrancene derivative such as 2-t-butyl-9,10-di(2-naphthyl)anthracene (TBADN), and an naphthacene derivative represented by the following Formula (7); a distyrylarylene derivative; a perylene derivative; a distyrylbenzene derivative; a distyrylamine derivative; a quinolinolate-based metal complex such as a tris(8-quinolinolato) aluminum complex (Alq3); a triarylamine derivative such as a tetramer of triphenylamine; an oxadiazole derivative; a silole derivative; a dicarbazole derivative; an oligothiophene derivative; a benzopyran derivative; a triazole derivative; a benzoxazole derivative; a benzothiazole derivative; a quinoline derivative; and 4,4'-bis(2,2'-diphenyl vinyl)biphenyl (DPVBi). They can be used alone or in a combination of two or more thereof.

Further, when the red luminescent material contains the red phosphorescent material, examples of the fourth host material include carbazole derivatives such as 3-phenyl-4-(1'-naphthyl)-5-phenylcarbazole, and 4,4'-N,N'-dicarbazole-biphenyl (CBP). They can be used alone or in a combination of two or more thereof.

(5)

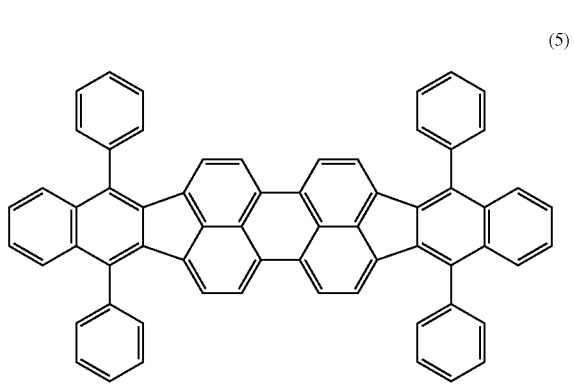 [SMILES: c1ccc(-c2c3c(c(-c4ccccc4)c4ccccc24)-c2ccc4c5ccc6c7c(ccc(c8ccc-3c2c84)c75)-c2c-6c(-c3ccccc3)c3ccccc3c2-c2ccccc2)cc1]

(6)

(7)

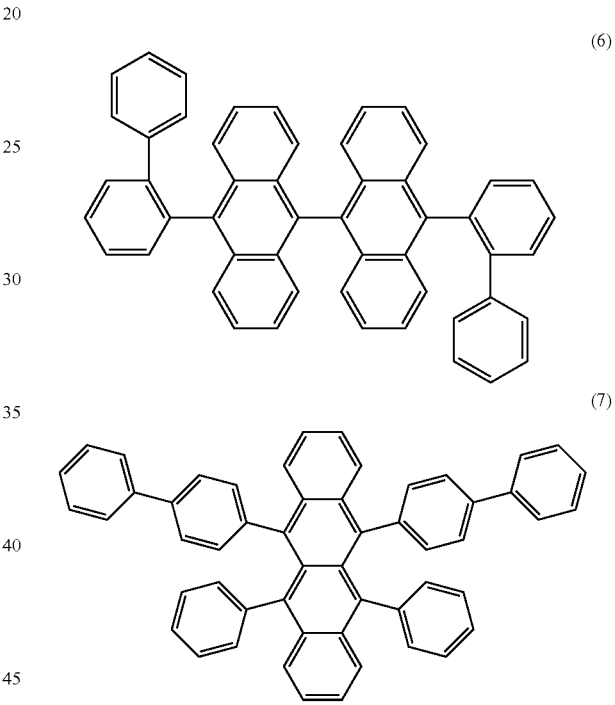

The content (doping amount) of the red luminescent material in the red light-emitting layer 61 is preferably 0.01 wt % to 10 wt %, and more preferably 0.1 wt % to 5 wt %. When the content of the red luminescent material is within the above range, it is possible to optimize a luminous efficiency, and it is possible to allow the red light-emitting layer 61 to emit light while adjusting the balance of the luminescence amount between the red light-emitting layer 61 and the following blue light-emitting layer 63 or first green light-emitting layer 64.

The average thickness of the red light-emitting layer 61 is not particularly limited, but is preferably about 1 nm to 20 nm, and more preferably about 3 nm to 10 nm.

Intermediate Layer

The intermediate layer 62 is provided between the above-mentioned red light-emitting layer 61 and the following blue light-emitting layer 63 so as to be in contact with these layers 61 and 63. In addition, this intermediate layer 62 has a function of adjusting the amount of electrons transported from the blue light-emitting layer 63 to the red light-emitting layer 61. Further, the intermediate layer 62 has a function of adjusting the amount of holes transported from the red light-emitting layer 61 to the blue light-emitting layer 63. The intermediate layer 62 has a function of preventing the energy of excitons from being transferred between the red light-emitting layer 61 and the blue light-emitting layer 63. Thanks to this function, it is possible to allow each of the red light-emitting layer 61 and the blue light-emitting layer 63 to efficiently emit light. As a result, it is possible to allow each of the light-emitting layer to emit light in a well-balanced manner, and thus the light-emitting element 1 can emit light of a desired color (white in the present embodiment), and the luminous efficiency and emission lifetime of the light-emitting element 1 can be improved.

The constituent material of this intermediate layer 62 is not particularly limited as long as the intermediate layer 62 can exhibit the above-mentioned function, but, for example, a material (hole transporting material) having a function of transporting holes, a material (electron transporting material) having a function of transporting electrons, or the like can be used.

The hole transporting material used in the intermediate layer 62 is not particularly limited as long as the intermediate layer 62 can exhibit the above-mentioned function. For example, among the above-mentioned hole transporting materials, an amine-based compound having an amine skeleton can be used, but benzidine-based amine derivatives are preferably used.

In particular, among the benzidine-based amine derivatives, as the amine-based compound used in the intermediate layer 62, an amine-based compound having two or more aromatic ring groups is preferable, and a tetraarylbenzidine derivative is more preferable. Examples of the benzidine-based amine derivative include N,N'-bis(1-naphthyl)-N,N'-diphenyl[1,1'-biphenyl]-4,4'-diamine (α-NPD) represented by the above Formula (2), N,N,N',N'-tetranaphthyl-benzidine (TNB), and the like. Such an amine-based compound is generally excellent in hole transportability. Therefore, it is possible to easily transfer holes from the red light-emitting layer 61 to the blue light-emitting layer 63 through the intermediate layer 62.

The electron transporting material used in the intermediate layer 62 is not particularly limited as long as the intermediate layer 62 can exhibit the above-mentioned function, and, for example, an acene-based compound can be used. Since the acene-based compound is excellent in electron transportability, it is possible to easily transfer electrons from the blue light-emitting layer 63 to the red light-emitting layer 61 through the intermediate layer 62. In addition, since the acene-based compound is excellent in the system of excitons, the degradation of the intermediate layer 62 due to excitons can be prevented or suppressed, thus improving the durability of the light-emitting element 1.

Examples of the acene-based compound include a naphthalene derivative, an anthracene derivative, a tetracene derivative, a pentacene derivative, a hexacene derivative, a heptacene derivative, and the like. They can be used alone or in a combination of two or more thereof, but a naphthalene derivative and an anthracene derivative are preferably used, and an anthracene derivative is more preferably used. Examples of the anthracene derivative include an anthracene derivative represented by the above Formula (6), 2-t-butyl-9,10-di-2-naphthyl anthracene (TBADN), and the like.

As the constituent material of this intermediate layer 62, a host material which is the same as the above-described fourth host material of the red light-emitting layer 61 may be used, and an assist dopant material which is the same as the above-described second assist dopant material of the blue light-emitting layer 63 may also be used.

The average thickness of the intermediate layer 62 is not particularly limited, but is preferably about 5 nm to 50 nm, and more preferably about 10 nm to 30 nm.

Blue Light-Emitting Layer

The blue light-emitting layer (first light-emitting layer) 63 emits light of blue color (first color), and is configured to contain a blue luminescent material (first luminescent material) emitting light of blue color (first color), a host material (first host material) supporting the blue luminescent material, and an assist dopant material (first assist dopant material) having mobility opposite to this host material.

Such a blue luminescent material is not particularly limited. As the blue luminescent material, various blue fluorescent materials and blue phosphorescent materials can be used alone or in a combination of two or more thereof.

The blue fluorescent material is not particularly limited as long as it emits blue fluorescence, but examples thereof include a distyrylamine derivative such as a distyryldiamine-based compound represented by the following Formula (8), a fluoranthene derivative, a pyrene derivative, perylene and perylene derivative, an anthracene derivative, a benzoxazole derivative, a benzothiazole derivative, a benzimidazole derivative, a chrysene derivative, a phenanthrene derivative, a distyrylbenzene derivative, tetraphenyl butadiene, 4,4'-bis(9-ethyl-3-carbazovinylene)-1,1'-biphenyl (BCzVBI), poly[(9.9-dioctylfluorene-2,7-diyl)-co-(2,5-dimethoxybenzene-1,4-diyl)], poly[(9,9-di-hexyloxyfluorene-2,7-diyl)-ortho-co-(2-methoxy-5-{2-ethoxyhexyloxy}phenylene-1,4-diyl)], and poly [(9,9-dioctylfluorene-2,7-diyl)-co-(ethynyl benzene)]. They can be used alone or in a combination of two or more thereof.

(8)

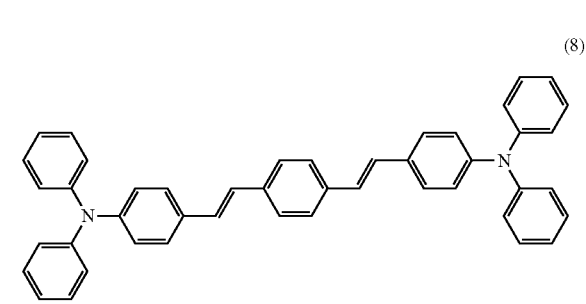 [SMILES: C(=C\c1ccc(N(c2ccccc2)c2ccccc2)cc1)/c1ccc(/C=C/c2ccc(N(c3ccccc3)c3ccccc3)cc2)cc1]

The blue phosphorescent material is not particularly limited as long as it emits blue phosphorescence, and, examples thereof include metal complexes such as an iridium complex, a ruthenium complex, a platinum complex, an osmium complex, a rhenium complex, and a palladium complex. Specific examples thereof include bis[4,6-difluorophenylpyridinate-N,$C^{2'}$]-picolinate-iridium, tris[2-(2,4-difluorophenyl)pyridinate-N,$C^{2'}$]iridium, bis[2-(3,5-trifluoromethyl)pyridinate-N,$C^{2'}$]-picolinate-iridium, and bis(4,6-difluorophenylpyridinate-N,$C^{2'}$)iridium (acetylacetonate).

Meanwhile, as the constituent material of the blue light-emitting layer 63, a host material (first host material) using the blue luminescent material as a guest material is included in addition to the blue luminescent material (luminescent material). This host material recombines holes and electrons to generate exitons, and simultaneously transfers (Forster-transfers or Dexter-transfers) energy of the excitons to the blue luminescent material to have a function of exciting the blue luminescent material. For example, such a host material is doped with the blue luminescent material (guest material)

as a luminescent dopant, and is then used. As this first host material, a host material which is the same as the above-described fourth host material of the red light-emitting layer 61 can be used, but, among them, an acene-based compound is preferable. Since the acene-based compound is a host material having high electron transportability, it can be suitably used as the host material of the blue light-emitting layer 63 required to easily supply electrons to the red light-emitting layer 61 side.

Meanwhile, as the constituent material of the blue light-emitting layer 63, an assist dopant material (first assist dopant material) is included in addition to the blue luminescent material (luminescent material) and the host material (first host material).

This assist dopant material is a material having mobility opposite to the host material, that is, a material having high hole transportability when the host material has high electron transportability. Further, this assist dopant material is a material having high electron transportability when the host material has high hole transportability. Since this assist dopant material has mobility opposite to the host material, in such a blue light-emitting layer 63, it is possible to transfer holes and electrons with good balance, thus exhibiting a function of adjusting a position in the thickness direction at which excitons are generated by the recombination of holes and electrons. This assist dopant material, for example, is mixed with the host material, and is then used.

Meanwhile, in the blue light-emitting layer 63 with the above configuration, generally, since it is required to easily supply electrons to the red light-emitting layer 61 side, a material having high electron transportability is used as the host material. Therefore, as the assist dopant material, a material having high hole transportability is suitably selected.

The assist dopant material (first assist dopant material) is not particularly limited as long as it has mobility opposite to the host material, but examples thereof include N,N'-di(1-naphthyl)-N,N'-diphenyl-1,1'-biphenyl-4,4'-diamine (α-NPD) represented by the following Formula (2), N,N'-diphenyl-N,N'-bis(3-methylphenyl)-1,1'-biphenyl-4,4'-diamine (TPD), a compound represented by the following Formula (3), a tetraarylbenzidine derivative such as a compound represented by Formula (4), a tetraaryldiaminofluorene compound or a derivative thereof (amine-based compound), an oxadiazole derivative, a perylene derivative, a pyridine derivative, a pyrimidine derivative, a quinoxaline derivative, and a diphenylquinone derivative. They can be used alone or in a combination of two or more thereof.

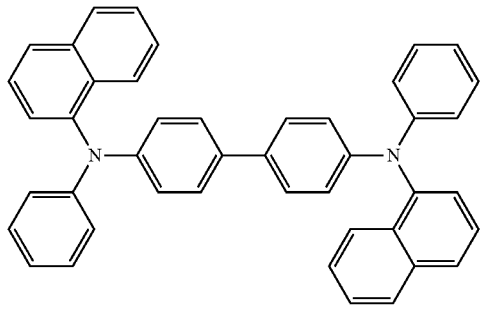

(2)

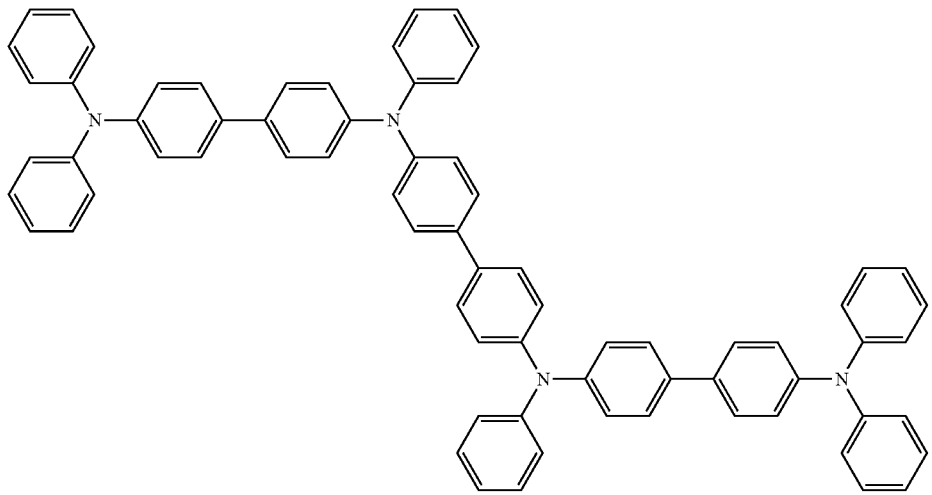

(3)

-continued

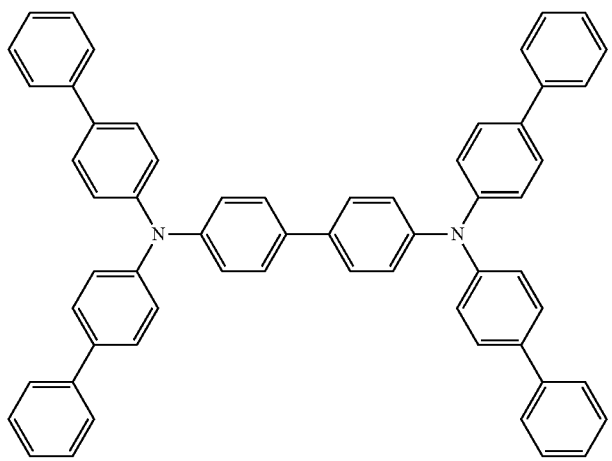

(4)

The content (doping amount) of the blue luminescent material in the blue light-emitting layer 63 is preferably 0.01 wt % to 20 wt %, and more preferably 1 wt % to 15 wt %. When the content of the blue luminescent material is within the above range, it is possible to optimize luminous efficiency, and it is possible to allow the blue light-emitting layer 63 to emit light while adjusting the balance of the luminescence amount between the blue light-emitting layer 63 and the red light-emitting layer 61 or the following first green light-emitting layer 64.

The average thickness of the blue light-emitting layer 63 is not particularly limited, but is preferably about 5 nm to 50 nm, and more preferably about 10 nm to 40 nm.

First Green Light-Emitting Layer

The first green light-emitting layer (second light-emitting layer) 64 emits light of green color (second color) different from blue color (first color), and is configured to contain a green luminescent material (second luminescent material) emitting light of green color (second color), a host material (second host material) supporting the green luminescent material, and an assist dopant material (second assist dopant material) having mobility opposite to this host material.

Such a green luminescent material is not particularly limited. As the green luminescent material, various green fluorescent materials and green phosphorescent materials can be used alone or in a combination of two or more thereof.

The green fluorescent material is not particularly limited as long as it emits green fluorescence, but examples thereof include a coumarin derivative, quinacridone and a derivative thereof such as a quinacridone derivative represented by the following Formula (9), 9,10-bis[(9-ethyl-3-carbazole)-vinylenyl]-anthracene, poly(9,9-dihexyl-2,7-vinylenefluorenylene), Poly[(9,9-dioctylfluorene-2,7-diyl)-co-(1,4-diphenylene-vinylene-2-methoxy-5-{2-ethylhexyloxy}benzene)], and poly[(9,9-dioctyl-2,7-divinylenefluorenylene)-ortho-co-(2-methoxy-5-(2-ethoxylhexyloxy)-1,4-phenylene)]. They can be used alone or in a combination of two or more thereof.

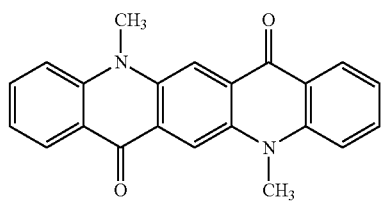

(9)

The green phosphorescent material is not particularly limited as long as it emits green phosphorescence, and, examples thereof include metal complexes such as an iridium complex, a ruthenium complex, a platinum complex, an osmium complex, a rhenium complex, and a palladium complex. Among them, at least one of ligands of this metal complex preferably has a phenyl pyridine skeleton, a bipyridyl skeleton, a porphyrin skeleton, or the like. Specific examples thereof include fac-tris(2-phenylpyridine)iridium (Ir(ppy)3), bis(2-phenylpyridinate-N,$C^{2'}$)iridium (acetylacetonate), and fac-tris[5-fluoro-2-(5-trifluoromethyl-2-pyridine)phenyl-C,N]iridium.

Meanwhile, as the constituent material of the first green light-emitting layer 64, a host material (second host material) using the green luminescent material as a guest material is included in addition to the green luminescent material (luminescent material). This host material recombines holes and electrons to generate exitons, and simultaneously transfers (Forster-transfers or Dexter-transfers) energy of the excitons to the green luminescent material to have a function of exciting the green luminescent material. For example, such a host material is doped with the green luminescent material (guest material) as a luminescent dopant, and is then used. As this second host material, a host material which is the same as the above-described fourth host material of the red light-emitting layer 61 can be used, but, among them, an acene-based compound is preferable. Since the acene-based compound is a host material having high electron transportability, it can be suitably used as the host material of the first green light-emitting layer 64 required to easily supply electrons to the red light-emitting layer 61 side.

Meanwhile, as the constituent material of the first green light-emitting layer 64, an assist dopant material (second assist dopant material) having mobility opposite to the host material is included in addition to the green luminescent material (luminescent material) and the host material (second host material).

Since this assist dopant material has mobility opposite to the host material, in such a first green light-emitting layer 64, it can exhibit a function of adjusting a position in the thickness direction at which excitons are generated by the recombination of holes and electrons. This assist dopant material, for example, is mixed with the host material, and is then used.

As the assist dopant material (second assist dopant material), for example, an assist dopant material which is the same as the above-described first assist dopant material of the blue light-emitting layer 63 can be used.

Meanwhile, in the first green light-emitting layer 64 with above configuration, similarly to the blue light-emitting layer 63, generally, since it is required to easily supply electrons to the red light-emitting layer 61 side, a material having high electron transportability is used as the host material. Therefore, as the assist dopant material, a material having high hole transportability is suitably selected.

The content (doping amount) of the green luminescent material in the first green light-emitting layer 64 is preferably 0.01 wt % to 20 wt %, and more preferably 0.5 wt % to 15 wt %. When the content of the green luminescent material is within the above range, it is possible to optimize a luminous efficiency, and it is possible to allow the first green light-emitting layer 64 to emit light while adjusting the balance of the luminescence amount between the first green light-emitting layer 64 and the red light-emitting layer 61 or the blue light-emitting layer 63.

The average thickness of the first green light-emitting layer 64 is not particularly limited, but is preferably about 5 nm to 50 nm, and more preferably about 10 nm to 40 nm.

Second Green Light-Emitting Layer

The second green light-emitting layer (third light-emitting layer) 65 emits light of green color (third color) which is the same as green color (second color), and is configured to contain a green luminescent material (second luminescent material) emitting light of green color (third color), a host material (third host material) supporting the green luminescent material, and an assist dopant material (third assist dopant material) having mobility opposite to this host material.

This second green light-emitting layer 65 emits light of green color which is the same color as the first green light-emitting layer 64, that is, emits third light having the same color as second color. The second green light-emitting layer 65 has the same configuration as the first green light-emitting layer 64, except that the content of the third assist dopant material contained in the second green light-emitting layer 65 is lower than the content of the second assist dopant material contained in the first green light-emitting layer 64.

Meanwhile, the second green light-emitting layer 65 may not contain the assist dopant material depending on the kind and content of the assist dopant materials (first assist dopant material and second assist dopant material) of the blue light-emitting layer 63 and the first green light-emitting layer 64.

The average thickness of the second green light-emitting layer 65 is not particularly limited, but is preferably about 5 nm to 50 nm, and more preferably about 10 nm to 40 nm.

As described above, in the present embodiment, as light-emitting layers, the blue light-emitting layer 63, the first green light-emitting layer 64, and the second green light-emitting layer 65 are sequentially laminated on one side of the intermediate layer 62 toward the cathode 9, from the intermediate layer 62 (anode 3) side toward the cathode 9 side.

In the blue light-emitting layer 63, first green light-emitting layer 64, and second green light-emitting layer 65, generally, it is required to easily supply electrons to the red light-emitting layer 61 side, and thus a material having high electron transportability is used as the host material. Therefore, bias increases in the carrier transportability of electrons, and thus the recombination sites of carriers are concentrated in the vicinity of the interface between the intermediate layer 62 and the blue light-emitting layer 63. As a result, the light-emitting element 1 configured in this manner is generally problematic in that the luminance of the blue light-emitting layer 63 tends to deteriorate locally.

In order to overcome such a problem, each of the blue light-emitting layer 63, the first green light-emitting layer 64, and the second green light-emitting layer 65 is configured to contain an assist dopant material having mobility opposite to the host material (having high hole transportability) as a constituent material in addition to the luminescent material and the host material.

When each of the light-emitting layers 63 to 65 contains an assist dopant material, it is possible to control the carrier transportability in the light-emitting layers 63 to 65. As a result, the position in the thickness direction at which excitons are generated by the recombination of holes and electrons can be adjusted, and high efficiency and long lifetime of the light-emitting element 1 can be obtained. However, simply, just when each of the light-emitting layers contains the assist dopant material or the relationship between HOMO and LUMO of the host material and the assist dopant material is controlled, the carrier transportability of holes and electrons cannot be sufficiently controlled, and the recombination position of carriers in the light-emitting layers 63 to 65 cannot be set to a good position.

More specifically, when each of the light-emitting layers 63 to 65 contains the assist dopant material, a new problem has occurred that holes are easily transported in these light-emitting layers 63 to 65, and thus holes are supplied to the cathode 9 side compared to the second green light-emitting layer 65, and the constituent materials contained in the electron transporting layer 7 are altered and degraded, thereby deteriorating the luminescence characteristics of the light-emitting element 1.

In order to solve such a problem, in the invention, when the contents of assist dopant materials (first assist dopant material, second assist dopant material, and third assist dopant material) contained in the blue light-emitting layer (first light-emitting layer) 63, the first green light-emitting layer (second light-emitting layer) 64, and the second green light-emitting layer (third light-emitting layer) 65 are respectively expressed by $C_{Assist}(EML1)$, $C_{Assist}(EML2)$, and $C_{Assist}(EML3)$, the contents of the assist dopant materials are set to satisfy the following Relational Expression (A).

$$C_{Assist}(EML1) \geq C_{Assist}(EML2) > C_{Assist}(EML3) \geq 0 \quad \text{(A)}$$

As such, in the invention, the content of the assist dopant material in the second green light-emitting layer 65 is set to be low compared to each of the contents of the assist dopant materials in the blue light-emitting layer 63 and the first green light-emitting layer 64. Thus, in the blue light-emitting layer 63 and the first green light-emitting layer 64, holes are easily transported, but, in the second green light-emitting layer 65, the transportation of holes is inhibited, compared to in the blue light-emitting layer 63 and the first green light-emitting layer 64. As a result, it is reliably suppressed or prevented that holes having passed through the blue light-emitting layer 63 and the first green light-emitting layer 64 pass through the second green light-emitting layer 65 and then reach the cathode 9 side compared to the second green light-emitting layer 65. That is, the second green light-emitting layer 65 functions as a block layer suppressing or preventing the passage of holes toward the cathode 9, compared to the light-emitting layers 63 to 65. Therefore, it is possible to reliably suppress or prevent the alteration or degradation of the constituent material contained in the electron transporting layer 7 or the like.

From the above, the position where carrier are recombined can be spaced sufficiently from the vicinity of the interface between the intermediate layer 62 and the blue light-emitting layer 63, and this recombination site can be suitably spread over the light-emitting layers 63 to 65, and thus local deterioration of a luminescent material (dopant material) in the vicinity of the interface is suppressed. As a result, the light-emitting element 1 has excellent luminescence characteristics and lifetime characteristics maintaining such luminescence characteristics over a long period of time.

Meanwhile, in each of the light-emitting layers 63 to 65, when mobility of holes is expressed by $\mu h$ [cm$^2$/Vs] and mobility of electrons is expressed by $\mu e$ [cm$^2$/Vs], in the light-emitting layers 63 and 64, it is preferable that the mobility ratio $\mu e/\mu h$, that is, the relationship of mobility of holes and mobility of electrons in the light-emitting layers 63 and 64 satisfies the following Relational Expression (1).

$$0.01 \leq \mu e/\mu h \leq 100 \tag{1}$$

When the Relational Expression (A) is satisfied, the relationship of the Relational Expression (1) can be easily satisfied, and thus, in the light-emitting layers 63 and 64, it is possible to transfer holes and electrons with good balance. Therefore, the position where carrier are recombined (recombination site) can be spaced sufficiently from the vicinity of the interface between the intermediate layer 62 and the blue light-emitting layer 63, and this recombination site can be spread over the light-emitting layers 63 and 64 in a wider range, thus satisfactorily exhibiting the above effect.

Meanwhile, the value of mobility ratio $\mu e/\mu h$ can be obtained by measuring the hole mobility and electron mobility of the light-emitting layer using impedance spectroscopy and then calculating the ratio thereof.

The value of $\mu e/\mu h$, as shown in the Relational Expression (1), is preferably 0.01 to 100, and more preferably 0.1 to 10. Thus, it is possible to spread the recombination site in the light-emitting layers 63 and 64 more reliably.

Further, in the second green light-emitting layer 65, it is preferable that the mobility ratio $\mu e/\mu h$, that is, the relationship of mobility of holes and mobility of electrons in the second green light-emitting layer 65 satisfies the following Relational Expression (2).

$$\mu e/\mu h \geq 100 \tag{2}$$

When the Relational Expression (A) is satisfied, the relationship of the Relational Expression (2) can be easily satisfied, and thus, in the second green light-emitting layer 65, it is possible to more reliably suppress or prevent the holes having passed through the light-emitting layers 63 and 64 from passing through the second green light-emitting layer 65 and then reaching the cathode 9 side compared to the second green light-emitting layer 65. Further, since the holes not having reached the cathode 9 side compared to the second green light-emitting layer 65 are recombined with electrons in the second green light-emitting layer 65, the luminous efficiency in the second green light-emitting layer 65 can be improved.

The value of as shown in the Relational Expression (2), is preferably 100 or more, and more preferably 200 or more. Thus, since it is possible to prevent holes from reaching the cathode 9 side compared to the second green light-emitting layer 65 more reliably, the luminous efficiency in the second green light-emitting layer 65 can be more improved.

Meanwhile, when the above-mentioned acene-based compound is used as a host material, an amine-based compound is preferably used as each of the assist dopant materials (first to third assist dopant materials). Accordingly, the Relational Expression (A) is satisfied, and thus the value of $\mu e/\mu h$ increases, and the Relational Expressions (1) and (2) can also be easily satisfied.

In addition, it is preferable that the acene-based compound is the compound represented by Formula (4). Thus, the above effect can be remarkably exhibited.

Meanwhile, it is preferable that the assist dopant materials (first to third assist dopant materials) contained in the light-emitting layers 63 to 65 are homogeneous or identical to each other (in particular, identical to each other), and it is preferable that the host materials (first to third host materials) contained in the light-emitting layers 63 to 65 are homogeneous or identical to each other (in particular, identical to each other). Accordingly, the Relational Expression (A) is satisfied, and thus the value of $\mu e/\mu h$ increases, and the Relational Expressions (1) and (2) can also be more easily satisfied.

Meanwhile, the content of the assist dopant material, specifically, the content of the assist dopant material in each of the light-emitting layers 63 and 64 is preferably 20 wt % or more and 70 wt % or less, more preferably 20 wt % or more and 50 wt % or less. By setting the content of the assist dopant material to be within the above range, the content thereof can be easily set to satisfy the above Relational Expression (1). Further, the content of the assist dopant material in the second green light-emitting layer 65 is preferably 0 wt % or more and less than 20 wt %, and more preferably 0 wt % or more and 10 wt % or less. By setting the content of the assist dopant material to be within the above range, the content thereof can be easily set to satisfy the above Relational Expression (2).

Meanwhile, the thickness of each of the first green light-emitting layer 64 and the second green light-emitting layer 65 is not particularly limited as long as it is within the above range, but, when the thicknesses of the light-emitting layers 64 and 65 are respectively expressed by T(EML2) and T(EML3), it is preferable that the thicknesses T(EML2) and T(EML3) satisfy the relationship of T(EML2)≤T(EML3). As such, when thickness of the second green light-emitting layer 65 is equal to or greater than that of the first green light-emitting layer 64, it is possible for the second green light-emitting layer 65 to exhibit the function as a block layer suppressing or preventing the passage of holes toward the cathode 9 side compared to light-emitting layers 63 to 65.

Electron Transporting Layer

The electron transporting layer 7 has a function of transporting the electrons injected from the cathode 9 through the electron injection layer 8 to the second green light-emitting layer 65.

Examples of the constituent material (electron transporting material) of the electron transporting layer 7 include a phenanthroline derivative such as 2,9-dimethyl-4,7-diphenyl-1,10-phenanthroline (BCP), a quinoline derivative such as tris(8-quinolinolato)aluminum (Alq$_3$) represented by the following Formula (10) which is an organic metal complex having 8-quinolinol or a derivative thereof as a ligand, a azainodolizine derivative such as a compound represented by the following Formula (11), an oxadiazole derivative, a perylene derivative, a pyridine derivative, a pyrimidine derivative, a quinoxaline derivative, a diphenylquinone derivative, and a nitro-substituted fluorene derivative. They can be used alone or in a combination of two or more thereof.

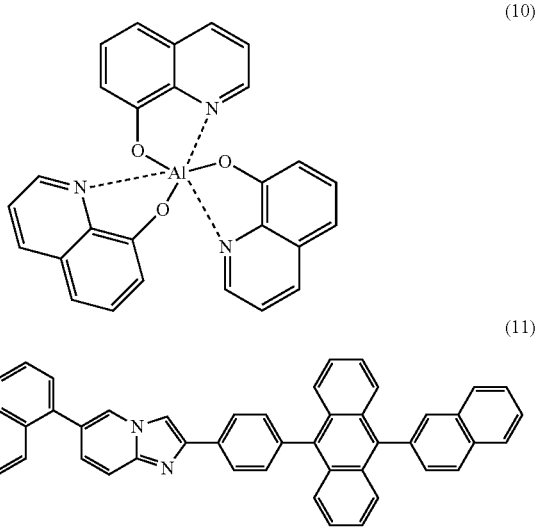

The average thickness of the electron transporting layer 7 is not particularly limited, but is preferably about 0.5 nm to 100 nm, and more preferably about 1 nm to 50 nm.

Electron Injection Layer

The electron injection layer 8 is a layer having a function of improving an electron injection efficiency from the cathode 9.

As the constituent material (electron injecting material) of the electron injection layer 8, there are exemplified various inorganic insulating materials and various inorganic semiconductor materials.

Examples of the inorganic insulating materials include alkali metal chalcogenides (oxides, sulfides, selenides, tellurides), alkaline earth metal chalcogenides, alkali metal halides, and alkaline earth metal halides. They can be used alone or in a combination of two or more thereof. When the electron injection layer is formed using this inorganic insulating material as a main material, it is possible to more improve electron injecting performance. Particularly, since an alkali metal compound (alkali metal chalcogenide or alkali metal halide) has a very low work function, when the electron injection layer 8 is formed using this alkali metal compound, the light-emitting element 1 exhibits high luminance.

Examples of alkali metal chalcogenides include $Li_2O$, LiO, $Na_2S$, $Na_2Se$, and NaO.

Examples of alkaline earth metal chalcogenides include CaO, BaO, SrO, BeO, BaS, MgO, and CaSe.

Examples of alkali metal halides include CsF, LiF, NaF, KF, LiCl, KCl, and NaCl.

Examples of alkaline earth metal halides include $CaF_2$, $BaF_2$, $SrF_2$, $MgF_2$, and $BeF_2$.

Examples of inorganic semiconductor materials include oxides, nitrides, and oxynitrides each containing at least one element of Li, Na, Ba, Ca, Sr, Yb, Al, Ga, In, Cd, Mg, Si, Ta, Sb, and Zn. They can be used alone or in a combination of two or more thereof.

The average thickness of this electron injection layer 8 is not particularly limited, but is preferably about 0.1 nm to 1000 nm, more preferably about 0.2 nm to 100 nm, and still more preferably 0.2 nm to 50 nm.

Sealing Member

The sealing member 10 is provided to cover the anode 3, the laminate 15, and the cathode 9, and has a function of hermetically sealing these components and blocking oxygen or moisture. When the sealing member 10 is provided, it is possible to obtain the effects in improving the reliability of the light-emitting element 1 and preventing the alteration and degradation thereof (improving the durability thereof).

Examples of the constituent material of the sealing member 10 include Al, Au, Cr, Nb, Ta, Ti, and alloys thereof, silicon oxide, and various resin materials. When a material having conductivity is used as the constituent material of the sealing member 10, in order to short-circuiting, if necessary, an insulation film is preferably provided between the sealing member 10 and the anode 3, the sealing member 10 and the laminate 15, and the sealing member 10 and the cathode 9.

In addition, the sealing member 10 has a flat plate shape. The sealing member 10 faces the substrate 2, and the space between the sealing member 10 and the substrate 2 may be sealed with a sealant such as a thermosetting resin.

The above-described light-emitting element 1, for example, can be manufactured as follows.

[1] First, a substrate 2 is prepared, and an anode is formed on the substrate 2.

The anode 3 can be formed by chemical vapor deposition (CVD) such as plasma CVD or thermal CVD, dry plating such as vacuum deposition, wet plating such as electroplating, a spraying method, a sol-gel method, a MOD method, metal foil junction, or the like.

[2] Next, a hole injection layer 4 is formed on the anode 3.

The hole injection layer 4 can be formed by CVD or a gas-phase process using dry plating such as vacuum deposition or sputtering.

In addition, the hole injection layer 4 can be formed by supplying a material for forming a hole injection layer, the material being prepared by dissolving a hole injecting material in a solvent or dispersing it in a dispersion medium, onto the anode 3 and then drying the material (removing a solvent or a dispersion medium).

As the method of supplying the material for forming a hole injection layer, various application methods, such as spin coating, roll coating and ink jet printing, can be used. When such application methods are used, the hole injection layer 4 can be formed comparatively easily.

As the solvent or dispersion medium used in the preparation of the material for forming a hole injection layer, there are exemplified various inorganic solvent, various organic solvent, and mixed solvents thereof.

In addition, the drying of the applied material can be performed by leaving under the atmosphere or depressurizing atmosphere, heat treatment or spraying of inert gas.

Prior to this step, the upper surface of the anode 3 may be treated with oxygen plasma. Thus, lyophilicity can be imparted to the upper surface of the anode 3, organic matter attached to the upper surface of the anode 3 can be removed (the upper surface of the anode 3 can be washed), and the work function of the vicinity of the upper surface of the anode 3 can be adjusted.

Here, preferably, the oxygen plasma treatment is performed under the conditions of a plasma power of about 100 W to 800 W, an oxygen gas flow rate of about 50 mL/min to 100 mL/min, a member to be processed (anode 3) transportation speed of about 0.5 mm/sec to 10 mm/sec, and temperature of the substrate 2 of about 70° C. to 90° C.

[3] Next, a hole transporting layer 5 is formed on the hole injection layer 4.

The hole transporting layer 5 can be formed by CVD or a gas-phase process using dry plating such as vacuum deposition or sputtering.

In addition, the hole transporting layer 5 can be formed by supplying a material for forming a hole transporting layer, the material being prepared by dissolving a hole transporting material in a solvent or dispersing it in a dispersion medium, onto the hole injection layer 4 and then drying the material (removing a solvent or a dispersion medium).

[4] Next, a red light-emitting layer 61 is formed on the hole transporting layer 5.

The red light-emitting layer 61 can be formed by CVD or a gas-phase process using dry plating such as vacuum deposition or sputtering.

[5] Next, an intermediate layer 62 is formed on the red light-emitting layer 61.

The intermediate layer 62 can be formed by CVD or a gas-phase process using dry plating such as vacuum deposition or sputtering.

[6] Next, a blue light-emitting layer 63 is formed on the intermediate layer 62.

The blue light-emitting layer 63 can be formed by CVD or a gas-phase process using dry plating such as vacuum deposition or sputtering.

[7] Next, a first green light-emitting layer 64 is formed on the blue light-emitting layer 63.

The first green light-emitting layer 64 can be formed by CVD or a gas-phase process using dry plating such as vacuum deposition or sputtering.

[8] Next, a second green light-emitting layer 65 is formed on the first green light-emitting layer 64.

The second green light-emitting layer 65 can be formed by CVD or a gas-phase process using dry plating such as vacuum deposition or sputtering.

[9] Next, an electron transporting layer 7 is formed on the second green light-emitting layer 65.

The electron transporting layer 7 can be formed by CVD or a gas-phase process using dry plating such as vacuum deposition or sputtering.

In addition, the electron transporting layer 7 can be formed by supplying a material for forming an electron transporting layer, the material being prepared by dissolving an electron transporting material in a solvent or dispersing it in a dispersion medium, onto the second green light-emitting layer 65 and then drying the material (removing a solvent or a dispersion medium).

[10] Next, an electron injection layer 8 is formed on the electron transporting layer 7.

When an inorganic material is used as the constituent material of the electron injection layer 8, the electron injection layer 8 can be formed by CVD, a gas-phase process using dry plating such as vacuum deposition or sputtering, or application and burning of inorganic particle ink.

[11] Next, a cathode 9 is formed on the electron injection layer 8.

The cathode 9 can be formed by vacuum deposition, sputtering, metal foil junction, or application and burning of metal particle ink.

Through the above steps, a light-emitting element 1 is obtained.

Finally, the obtained light-emitting element 1 is covered with the sealing member 10, and is attached to the substrate 2.

The above-mentioned light-emitting element 1 can be used in a light-emitting device (light-emitting device of the invention).

Such a light-emitting device can be driven at a comparatively low voltage because it is equipped with the above-mentioned light-emitting element 1.

In addition, such a light-emitting device can be used as a light source used in illumination or the like.

Meanwhile, when the plurality of light-emitting elements 1 in the light-emitting device are arranged in a matrix manner, it is possible to constitute a light-emitting device used in a display device.

Next, an example of a display device employing the display device of the invention will be described.

Figure 2:
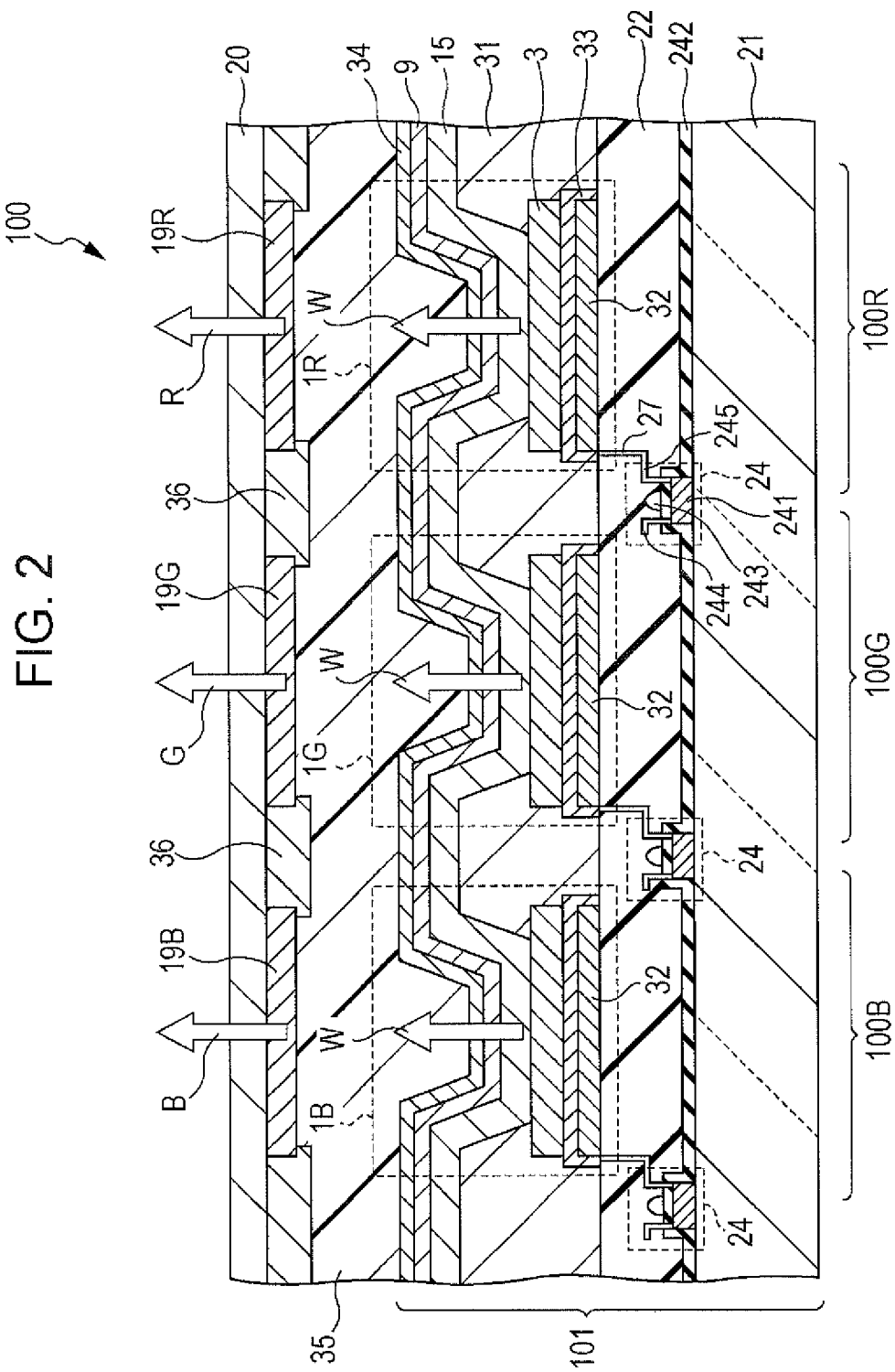
FIG. 2 is a longitudinal sectional view showing an embodiment of a display device employing the display device of the invention.

FIG. 2 is a longitudinal sectional view showing an embodiment of a display device employing the display device of the invention.

The display device 100 shown in FIG. 2 includes: a light-emitting device 101 including a plurality of light-emitting elements 1R, 1G and 1B provided in correspondence with sub-pixels 100R, 100G and 100B; and color filters 19R, 19G and 19B. Here, the display device 100 is a display panel having a top emission structure. The drive system of the display device 100 is not particularly limited, and may be either an active matrix system or a passive matrix system.

The light-emitting device 101 has a substrate 21, light-emitting elements 1R, 1G and 1B, and driving transistors 24.

A plurality of driving transistors 24 are provided on the substrate 21, and a planarizing layer 22 made of an insulating material is formed thereon to cover these driving transistors 24.

Each of the driving transistors 24 has a silicon-made semiconductor layer 241, a gate insulation layer 242 formed on the semiconductor layer 241, a gate electrode 243 formed on the gate insulation layer 242, a source electrode 244, and a drain electrode 245.

The planarizing layer 22 is provided with light-emitting elements 1R, 1G and 1B in correspondence with each of the driving transistors 24.

The light-emitting element 1R is configured such that a reflective film 32, an anti-corrosive film 33, an anode 3, a laminate 15, a cathode 9, and a cathode cover 34 are sequentially laminated on the planarizing layer 22. In the present embodiment, the anode 3 of each of the light-emitting elements 1R, 1G and 1B constitutes a pixel electrode, and is electrically connected to the drain electrode 245 of each of the driving transistors 24 by a conductive part (wiring) 27. In addition, the cathode 9 of each of the light-emitting elements 1R, 1G and 1B is used as a common electrode.

The configuration of each of the light-emitting elements 1G and 1B is the same as that of the light-emitting element 1R. In FIG. 2, the same elements as in FIG. 1 are indicated by the same reference numerals. The configuration (feature) of the reflective film 32 may be different between the light-emitting elements 1R, 1G and 1B depending on the wavelength of light. Partition walls 31 are respectively provided between the adjacent light-emitting elements 1R, 1G and 1B.

Meanwhile, an epoxy layer 35 made of an epoxy resin is formed on the light-emitting device 101 to cover this light-emitting device 101.

The color filters 19R, 19G and 19B are provided on the above-mentioned epoxy layer 35 in correspondence with the light-emitting elements 1R, 1G and 1B.

The color filter 19R converts white light W emitted from the light-emitting element 1R into red light. The color filter 19G converts white light W emitted from the light-emitting element 1G into green light. The color filter 19B converts white light W emitted from the light-emitting element 1B into blue light. When these color filters 19R, 19G and 19B are used in combination with the light-emitting elements 1R, 1G and 1B, it is possible to display a full color image.

Light-shielding layers 36 are respectively provided between the adjacent color filters 19R, 19G and 19B. Thus, it is possible to prevent unintended sub-pixels 100R, 100G, and 100B from emitting light.

A sealing substrate 20 is provided on the color filters 19R, 19G and 19B and the light-shielding layers 36 to cover them.

The above-mentioned display device 100 may be a monochromatic display device, and can realize a color display by selecting the luminescent material used in each of the light-emitting elements 1R, 1G and 1B.

This display device 100 (display device of the invention) can be driven at a comparatively low voltage because it uses the above-mentioned light-emitting device. Thus, it is possible to display a high-quality image with low power consumption.

Figure 3:
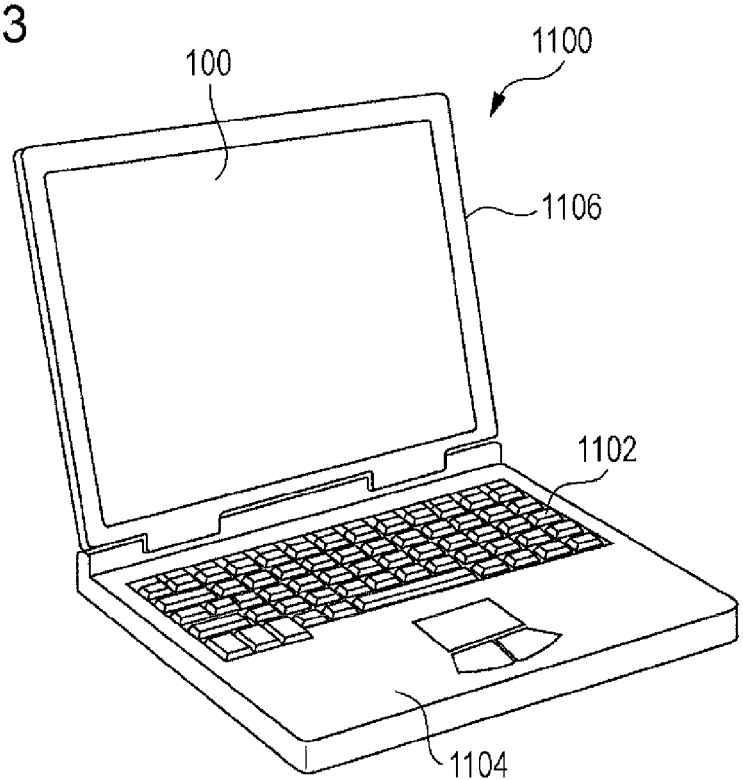
FIG. 3 is a perspective view showing a configuration of a mobile type (or notebook type) personal computer employing the electronic apparatus of the invention.

FIG. 3 is a perspective view showing a configuration of a mobile type (or notebook type) personal computer employing the electronic apparatus of the invention.

In FIG. 3, the personal computer 1100 includes a main body 1104 equipped with a keyboard 1102; and a display unit 1106 equipped with a display. The display unit 1106 is rotatably supported to the main body 1104 through a hinge structure.

In this personal computer 1100, the display of the display unit 1106 is composed of the above-mentioned display device 100.

Figure 4:
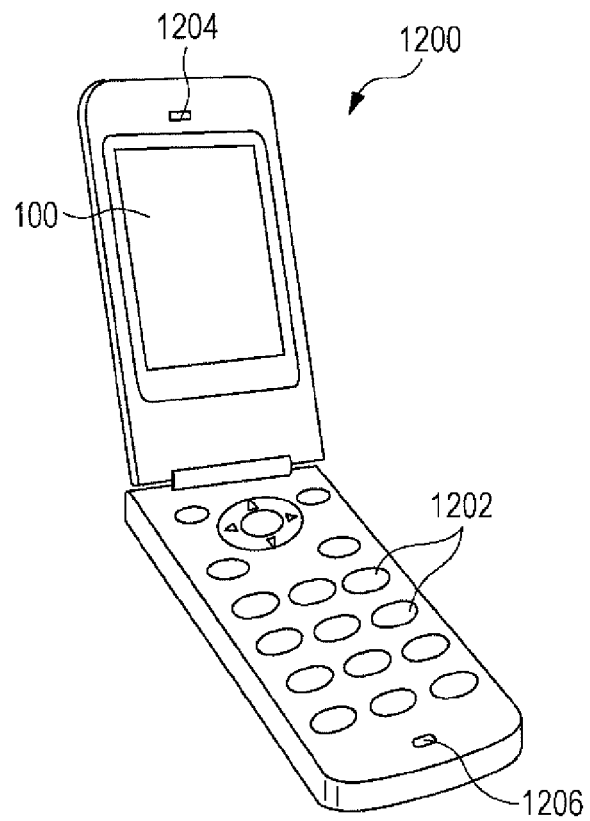
FIG. 4 is a perspective view showing a configuration of a mobile phone (including PHS) employing the electronic apparatus of the invention.

FIG. 4 is a perspective view showing a configuration of a mobile phone (including PHS) employing the electronic apparatus of the invention.

In FIG. 4, the mobile phone 1200 includes a plurality of manual operation buttons 1202, an ear piece 1204, a mouthpiece 1206, and a display.

In the mobile phone 1200, this display is composed of the above-mentioned display device 100.

Figure 5:
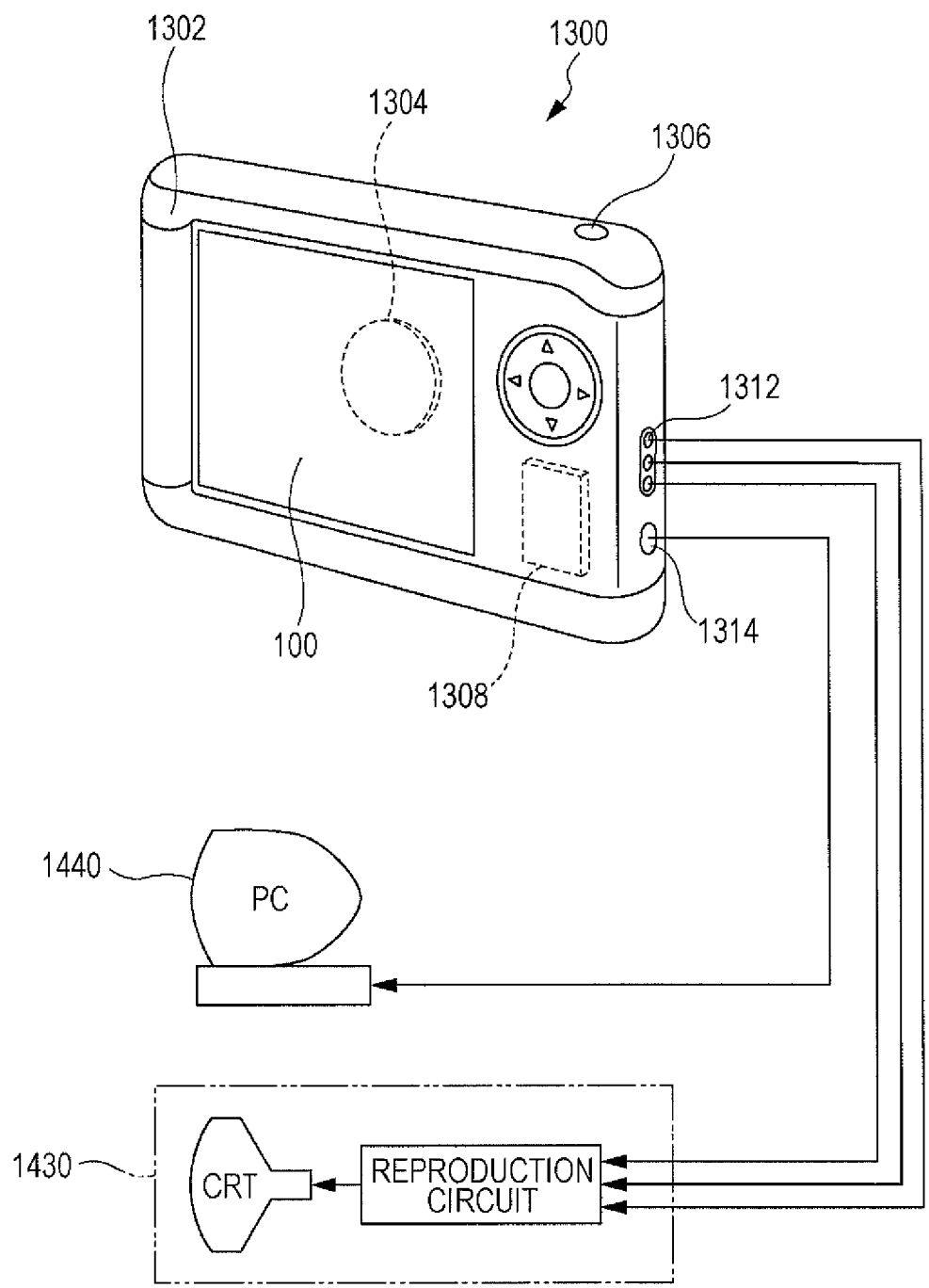
FIG. 5 is a perspective view showing a configuration of a digital still camera employing the electronic apparatus of the invention.

FIG. 5 is a perspective view showing a configuration of a digital still camera employing the electronic apparatus of the invention. In FIG. 5, the connection between the digital still camera and external devices is also briefly shown.

Here, a general camera exposes a silver salt film by the optical image of an object, whereas the digital still camera 1300 photoelectrically converts the optical image of an object using an imaging device such as a charge coupled device (CCD) to generate imaging signals (image signals).

A display is provided on the back side of a case (body) 1302 in the digital still camera 1300 to perform a displaying on the basis of the imaging signals caused by CCD. This display functions as a finder displaying an object as an electronic image.

In the digital still camera 1300, this display is composed of the above-mentioned display device 100.

The case 1302 is provided therein with a circuit board 1308. This circuit board 1308 is provided with memory capable of storing imaging signals.

In addition, the case 1302 is provided at the front side thereof (back side in the illustrated configuration) with a light-receiving unit 1304 including an optical lens (optical imaging system), CCD, or the like.

When a photographer confirms the image of an object shown in the display and then presses a shutter button 1306, the imaging signals of CCD at that time are transferred to the memory of the circuit board 1308 and stored therein.

Further, in this digital still camera 1300, the case 1302 is provided at the lateral side thereof with a video signal output terminal 1312 and an input-output terminal 1314 for data communication. As shown in FIG. 5, if necessary, a TV monitor 1430 is connected to the video signal output terminal 1312, and a personal computer 1440 is connected to the input-output terminal 1314 for data communication. Moreover, the imaging signals stored in the memory of the circuit board 1308 are output to the TV monitor 1430 or the personal computer 1440 by a predetermined operation.

The electronic apparatus of the invention can be applied to TVs, video cameras, viewfinder type and monitor direct view type videos tape recorders, laptop personal computers, car navigation equipment, pagers, electronic notebooks (including communication functions), electronic dictionaries, electronic calculators, electronic game equipment, word processors, workstations, video telephones, security television monitors, electronic binoculars, POS terminals, equipment provided with touch panels (for example, cash dispensers for financial institutions, and automatic ticket vending machines), medical equipment (for example, electronic thermometers, sphygmomanometers, blood glucose meters, electrocardiography displays, ultrasonographs, and endoscopic displays), fish sonars, various measurement equipment, meters and gauges (for example, meters and gauges for vehicles, aircrafts and ships), flight simulators, various other monitors, projection type displays such as projectors, and the like, in addition to the personal computer (mobile personal computer) of FIG. 3, the mobile phone of FIG. 4, and the digital still camera of FIG. 5.

As above, the light-emitting element, light-emitting device, display device and electronic apparatus of the invention have been described based on the illustrated embodiments, but the invention is not limited thereto.

For example, in the above-mentioned embodiment, there has been described a case that each of the blue light-emitting layer, first green light-emitting layer and second green light-emitting layer included in the light-emitting element contains a luminescent material, a host material, and an assist dopant material, but the invention is not limited to this case. For example, the red light-emitting layer included in the light-emitting element may contain a luminescent material, a host material, and an assist dopant material.

Further, in the above embodiment, a light-emitting element having a light-emitting layer of four layers has been described, but the light-emitting element may have a light-emitting layer of five or more layers.

EXAMPLES

Next, specific examples of the invention will be described.
1. Manufacture of Light-Emitting Element Example 1

<1> First, a transparent glass substrate having an average thickness of 0.5 mm was prepared. Then, an TTO electrode (anode) having an average thickness of 50 nm was formed on this substrate by sputtering.

Meanwhile, the substrate was immersed in acetone and 2-propanol in this order, ultrasonically cleaned, and then treated with oxygen plasma.

<2> Then, N,N'-bis(1-naphthyl)-N,N'-diphenyl[1,1'-biphenyl]-4,4'-diamine (α-NPD) represented by the above Formula (2) was deposited on the ITO electrode by vacuum evaporation to form a hole transporting layer having an average thickness of 40 nm.

<3> Then, a constituent material of a red light-emitting layer was deposited on the hole transporting layer by vacuum evaporation to form a red light-emitting layer (fourth light-emitting layer) having an average thickness of 5 nm. As the constituent material of the red light-emitting layer, a tetraaryl diindenoperylene derivative represented by the above Formula (5) was used as a red luminescent material (guest material), and a naphthacene derivative represented by the above Formula (7) was used as a host material. The content (doping concentration) of the red luminescent material (dopant) in the red light-emitting layer was set to 1.5 wt %.

<4> Then, a constituent material of an intermediate layer was deposited on the red light-emitting layer by vacuum evaporation to form an intermediate layer having an average thickness of 20 nm. As the constituent material of the intermediate layer, a mixture in which an anthracene derivative represented by the above Formula (6) and a compound represented by the above Formula (4) are mixed at a mixing ratio of 50:50 was used.

<5> Then, a constituent material of a blue light-emitting layer was deposited on the intermediate layer by vacuum evaporation to form a blue light-emitting layer (first light-emitting layer) having an average thickness of 15 nm. As the constituent material of the blue light-emitting layer, a distyryldiamine-based compound represented by the above Formula (8) was used as a blue luminescent material, an anthracene derivative represented by the above Formula (6) was used as a host material, and an amine derivative represented by the above Formula (4) was used as an assist dopant material. The content (doping concentration) of the blue luminescent material (dopant) in the blue light-emitting layer was set to 8.0 wt %, and the mixing ratio of the anthracene derivative represented by the above Formula (6) and the amine derivative represented by the above Formula (4) was set to 70:30.

<6> Then, a constituent material of the first green light-emitting layer was deposited on the blue light-emitting layer by vacuum evaporation to form a first green light-emitting layer (second light-emitting layer) having an average thickness of 5 nm. As the constituent material of the first green light-emitting layer, a quinacridone derivative represented by the above Formula (9) was used as a green luminescent material (guest material), an anthracene derivative represented by the above Formula (6) was used as a host material, and an amine derivative represented by the above Formula (4) was used as an assist dopant material. The content (doping concentration) of the green luminescent material (dopant) in the first green light-emitting layer was set to 1.0 wt %, and the mixing ratio of the anthracene derivative represented by the above Formula (6) and the amine derivative represented by the above Formula (4) was set to 70:30.

<7> Then, a constituent material of a second green light-emitting layer was deposited on the first green light-emitting layer by vacuum evaporation to form a second green light-emitting layer (third light-emitting layer) having an average thickness of 10 nm. As the constituent material of the second green light-emitting layer, a quinacridone derivative represented by the above Formula (9) was used as a green luminescent material (guest material), an anthracene derivative represented by the above Formula (6) was used as a host material, and an assist dopant material was not added. The content (doping concentration) of the green luminescent material (dopant) in the second green light-emitting layer was set to 1.0 wt %.

Meanwhile, the HOMO level, LUMO level, hole mobility and electron mobility of the anthracene derivative represented by the above Formula (6) used in the above steps <5> to <7> were 5.9 [eV], 2.9 [eV], less than $1.0 \times 10^{-9}$ [cm$^2$/Vs] and $7.0 \times 10^{-6}$ [cm$^2$/Vs], respectively. In addition, the HOMO level, LUMO level, hole mobility and electron mobility of the amine derivative represented by the above Formula (4) used in the steps <5> and <6> were 5.6 [eV], 2.5 [eV], $9.0 \times 10^{-4}$ [cm$^2$/Vs] and less than $1.0 \times 10^{-9}$ [cm$^2$/VS], respectively.

<8> Then, an azaindolizine derivative represented was deposited on the second green light-emitting layer by the above Formula (11) by vacuum evaporation to form an electron transporting layer having an average thickness of 25 nm.

<9> Then, lithium fluoride (LiF) was deposited on the electron transporting layer by vacuum evaporation to form an electron injection layer having an average thickness of 1 nm.

<10> Then, Al was deposited on the electron injection layer by vacuum evaporation to form an Al-made cathode having an average thickness of 100 nm.

<11> Then, in order to cover these formed layers, these layers was covered with a glass-made protection cover (sealing member), and this protection cover was fixed and sealed with an epoxy resin.

Through the above steps, the light-emitting element of Example 1, shown in FIG. 1, which emits white light, was manufactured.

Example 2

The light-emitting element of Example 2 was manufactured in the same manner as in Example 1, except that the constituent material of the second green light-emitting layer, used in the step <7>, was as follow.

That is, as the constituent material of the second green light-emitting layer, a quinacridone derivative represented by the above Formula (9) was used as a green luminescent material (guest material), an anthracene derivative represented by the above Formula (6) was used as a host material, and an amine derivative represented by the above Formula (4) was used as an assist dopant material. The content (doping concentration) of the green luminescent material (dopant) in the second green light-emitting layer was set to 1.0 wt %, and the mixing ratio of the anthracene derivative represented by the above Formula (6) and the amine derivative represented by the above Formula (4) was set to 90:10.

Comparative Example 1

The light-emitting element of Comparative Example 1 was manufactured in the same manner as in Example 1, except that the constituent materials of the blue light-emitting layer and the first green light-emitting layer, used in the steps <5> and <6>, were as follow, respectively, and that the second green light-emitting layer was not formed without conducting the step <7>.

That is, as the constituent material of the blue light-emitting layer, a distyryldiamine-based compound represented by the above Formula (8) was used as a blue luminescent material, an anthracene derivative represented by the above Formula (6) was used as a host material, and an assist dopant material was not added. The content (doping concentration) of the blue luminescent material (dopant) in the blue light-emitting layer was set to 8.0 wt %.

Further, as the constituent material of the first green light-emitting layer, a quinacridone derivative represented by the above Formula (9) was used as a green luminescent material (guest material), an anthracene derivative represented by the above Formula (6) was used as a host material, and an assist dopant material was not added. The content (doping concentration) of the green luminescent material (dopant) in the first green light-emitting layer was set to 1.0 wt %.

Comparative Example 2

The light-emitting element of Comparative Example 2 was manufactured in the same manner as in Example 1, except that the average thickness of the first green light-emitting layer formed in the step <6> was set to 15 nm, and the second green light-emitting layer was not formed without conducting the step <7>.

The kind and content of each of the constituent materials of the light-emitting element and the thickness of each of the constituent materials of the light-emitting element are summarized in Table 1 below.

As is apparent from Table 2, the light-emitting elements of Examples 1 and 2 satisfy the above Relational Expression (A). As a result, the emission liftetime in Examples 1 and 2 increased compared to that in Comparative Examples 1 and 2.

The entire disclosure of Japanese Patent Application No. 2014-078251, filed Apr. 4, 2014 is expressly incorporated by reference herein.

TABLE 1

| | | HTL | R-EML | | Intermediate layer | | EML1 (Blue) | | |
|---|---|---|---|---|---|---|---|---|---|
| | | | | | | | | | Thickness: nm |
| Ex. 1 | Material | HTL-1 | Host-2 | RD | Host1 | AD-1 | Host-1 | AD-1 | BD |
| | Concentration | | | 1.5 w % | 50:50 | | 70:30 | | 8 w % |
| | Thickness | 40 | | 5 | 20 | | | 15 | |
| Ex. 2 | Material | HTL-1 | Host-2 | RD | Host1 | AD-1 | Host-1 | — | BD |
| | Concentration | | | 1.5 w % | 50:50 | | | | 8 w % |
| | Thickness | 40 | | 5 | 20 | | | 15 | |
| Comp. Ex. 1 | Material | HTL-1 | Host-2 | RD | Host1 | AD-1 | Host-1 | AD-1 | BD |
| | Concentration | | | 1.5 w % | 50:50 | | 70:30 | | 8 w % |
| | Thickness | 40 | | 5 | 20 | | | 15 | |
| Comp. Ex. 2 | Material | HTL-1 | Host-2 | RD | Host1 | AD-1 | Host-1 | AD-1 | BD |
| | Concentration | | | 1.5 w % | 50:50 | | 70:30 | | 8 w % |
| | Thickness | 40 | | 5 | 20 | | | 15 | |

| | | EML2 (Green-1) | | | EML3 (Green-2) | | | ETL | EIL | Cathode |
|---|---|---|---|---|---|---|---|---|---|---|
| Ex. 1 | Material | Host-1 | AD-1 | GD | Host-1 | — | GD | ETL-1 | LiF | Al |
| | Concentration | 70:30 | | 1 w % | | | 1 w % | | | |
| | Thickness | | 5 | | | 10 | | 25 | 1 | 100 |
| Ex. 2 | Material | Host-1 | — | GD | Host-1 | AD-1 | GD | ETL-1 | LiF | Al |
| | Concentration | | | 1 w % | 90:10 | | 1 w % | | | |
| | Thickness | | 5 | | | 10 | | 25 | 1 | 100 |
| Comp. Ex. 1 | Material | Host-1 | AD-1 | GD | | | | ETL-1 | LiF | Al |
| | Concentration | 70:30 | | 1 w % | | | | | | |
| | Thickness | | 15 | | | | | 25 | 1 | 100 |
| Comp. Ex. 2 | Material | Host-1 | AD-1 | GD | | | | ETL-1 | LiF | Al |
| | Concentration | 70:30 | | 1 w % | | | | | | |
| | Thickness | | 15 | | | | | 25 | 1 | 100 |

2. Evaluation 2-1. Evaluation of Mobility Ratio μe/μh

In the light-emitting elements of Examples 1 and 2 and Comparative Examples 1 and 2, the hole mobility and electron mobility of each of the light-emitting layers were measured, and the ratio thereof was calculated to obtain the mobility ratio μe/μh.

2-2 Evaluation of Emission Lifetime

In the light-emitting elements of Examples 1 and 2 and Comparative Examples 1 and 2, the initial luminance of the light-emitting element was made constant using a DC power supply, and then the luminance thereof was measured using a luminance meter. Then, the time (LT80) taken for the measured luminance to become 80% of the initial luminance was measured. With respect to each of the light-emitting elements of Examples 1 and 2 and Comparative Example 2, when the LT80 measured by the light-emitting element of Comparative Example 1 was set to 100, relative value was obtained.

The evaluation results thereof are summarized in Table 2 below.

TABLE 2

| | | μe/μh | | |
|---|---|---|---|---|
| | Lifetime LT80 | EML1 | EML2 | EML3 |
| Ex. 1 | 230 | 6 | 10 | >7000 |
| Ex. 2 | 220 | 6 | 10 | 6000 |
| Comp. Ex. 1 | 100 | >7000 | >7000 | — |
| Comp. Ex. 2 | 180 | 6 | 10 | — |

What is claimed is:

1. A light-emitting element, comprising:
    a cathode;
    an anode; and
    a light-emitting unit provided between the cathode and the anode to emit light when a driving voltage is applied,
    wherein the light-emitting unit includes a first light-emitting layer emitting first light, a second light-emitting layer emitting second light having a different color from the first light, and a third light-emitting layer emitting third light having the same color as the second light, which are laminated from the anode side to the cathode side,
    wherein each of the first, second, and third light-emitting layers is configured to contain a luminescent material, a host material supporting the luminescent material, and an assist dopant material,
    wherein the host material is a material having high electron transportability, and the assist dopant material is a material having high hole transportability,
    wherein, when the contents of the assist dopant materials contained in the first, second, and third light-emitting layers are respectively expressed by $C_{Assist}(EML1)$, $C_{Assist}(EML2)$, and $C_{Assist}(EML3)$, the following Relational Expression (A) is satisfied:

$$C_{Assist}(EML1) \geq C_{Assist}(EML2) > C_{Assist}(EML3) \geq 0 \quad (A); \text{ and}$$

wherein, in each of the first, second, and third light-emitting layers, when mobility of holes is expressed by μh and mobility of electrons is expressed by μe, in the first light-emitting layer and the second light-emitting layer, the following Relational Expression (1) is satisfied:

$$0.01 \leq \mu e/\mu h \leq 100 \tag{1}$$

2. The light-emitting element according to claim 1, wherein, in the third light-emitting layer, the following Relational Expression (2) is satisfied:

$$\mu e/\mu h \geq 100 \tag{2}$$

3. The light-emitting element according to claim 1, wherein, when the thicknesses of the second and third light-emitting layers are respectively expressed by T(EML2) and T(EML3), the following Relational Expression (B) is satisfied:

$$T(EML2) \leq T(EML3) \tag{B}$$

4. The light-emitting element according to claim 1, wherein the host material is an acene-based compound.

5. The light-emitting element according to claim 1, wherein the assist dopant material is an amine-based compound.

6. The light-emitting element according to claim 5, wherein the amine-based compound is a compound represented by the following Formula (4):

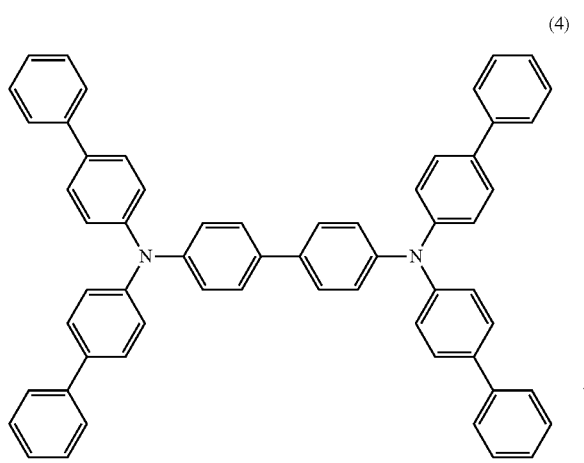

(4)

7. The light-emitting element according to claim 1, which emits light of white color as emission color.

8. A light-emitting device, comprising the light-emitting element according to claim 1.

9. A light-emitting device, comprising the light-emitting element according to claim 2.

10. A light-emitting device, comprising the light-emitting element according to claim 3.

11. A light-emitting device, comprising the light-emitting element according to claim 4.

12. A light-emitting device, comprising the light-emitting element according to claim 5.

13. A light-emitting device, comprising the light-emitting element according to claim 6.

14. A light-emitting device, comprising the light-emitting element according to claim 7.

15. A display device, comprising the light-emitting device according to claim 8.

16. An electronic apparatus, comprising the display device according to claim 15.

* * * * *